United States Patent
Candidus et al.

(10) Patent No.: US 7,432,713 B2
(45) Date of Patent: Oct. 7, 2008

(54) DIELECTRIC ELEMENT, AND MAGNETIC RESONANCE IMAGING METHOD USING SAME

(75) Inventors: Yvonne Candidus, Tuchenbach (DE); Thorsten Feiweier, Poxdorf (DE); Jürgen Huber, Erlangen (DE); Lothar Schön, Neunkirchen (DE); Thorsten Speckner, Marloffstein (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/756,780

(22) Filed: Jun. 1, 2007

(65) Prior Publication Data

US 2007/0279054 A1 Dec. 6, 2007

(30) Foreign Application Priority Data

Jun. 2, 2006 (DE) .................. 10 2006 025 940

(51) Int. Cl.
*G01V 3/00* (2006.01)
(52) U.S. Cl. ..................... 324/318; 600/421

(58) Field of Classification Search .............. 324/318, 324/322; 600/421
See application file for complete search history.

(56) References Cited

U.S. PATENT DOCUMENTS

| 4,719,406 | A  | * | 1/1988  | Schaefer et al. ........... 324/318 |
| 5,865,177 | A  | * | 2/1999  | Segawa ...................... 600/410 |
| 7,002,347 | B2 | * | 2/2006  | Feiweier et al. ............. 324/318 |
| 2005/0245816 | A1 |   | 11/2005 | Candidus et al. |

* cited by examiner

*Primary Examiner*—Louis M Arana
(74) *Attorney, Agent, or Firm*—Schiff Hardin LLP

(57) ABSTRACT

A dielectric element for positioning on an examination subject for locally influencing the B1 field distribution during magnetic resonance data acquisition contains a relaxation agent bound to mutually separated particles. The relaxation agent incorporates a paramagnetic substance. In a corresponding method for acquiring magnetic resonance data from an examination subject, such a dielectric element is positioned on the examination subject for locally influencing the $B_1$ field distribution, by homogenizing the $B_1$ field of a magnetic resonance apparatus.

21 Claims, 4 Drawing Sheets

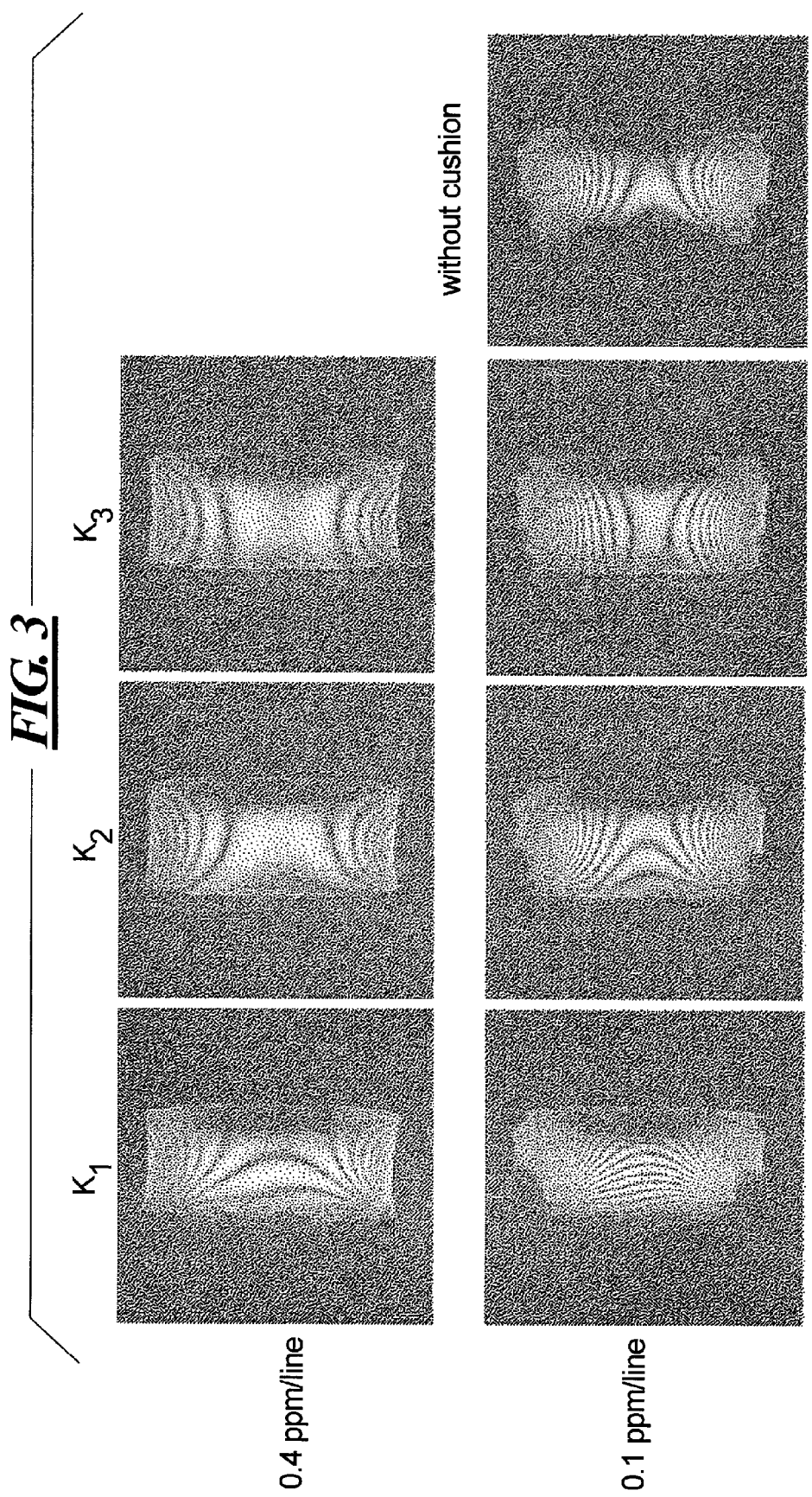

DIELECTRIC ELEMENT, AND MAGNETIC RESONANCE IMAGING METHOD USING SAME

BACKGROUND OF THE INVENTION

1. Field of the Invention

The present invention relates to a dielectric element for positioning on an examination subject for locally influencing the B1 field distribution during magnetic resonance recording. The invention additionally relates to a method for acquiring magnetic resonance data from an examination subject, wherein such a dielectric element is positioned on the examination subject for locally influencing the $B_1$ field distribution by homogenizing the $B_1$ field of a magnetic resonance apparatus.

2. Description of the Prior Art

Magnetic resonance tomography is a technique that is widely used for obtaining images inside the body of an examination subject. In order to obtain an image with this modality, i.e. to produce a magnetic resonance recording of an examination subject, the patient's body or a body part thereof under examination must first be exposed to a highly homogeneous static basic magnetic field (usually termed the $B_0$ field), which is generated by a basic field magnet of the magnetic resonance measuring device. During recording (data acquisition) of the magnetic resonance images, rapidly switched gradient fields generated by gradient coils are superimposed on this basic magnetic field for spatial coding. In addition, an RF antenna is used to radiate RE pulses of a defined field strength into the examination volume in which the examination subject is located. The magnetic flux density of these RF pulses is usually referred to as $B_1$. The pulse-shaped RF field is generally therefore also known as the $B_1$ field. By means of these RF pulses, the nuclear spins of the atoms in the examination subject are excited in such a way that they are deflected from their equilibrium position that is parallel to the basic magnetic field $B_0$ by a so-called "excitation flip angle" (hereinafter referred to as "flip angle" for short). The nuclear spins then precess around the direction of the base magnetic field $B_0$. The magnetic resonance signals generated thereby are detected by radio-frequency reception antennas. The reception antennas can be either the same antennas as were used to emit the radio-frequency pulses or separate receiving antennas. The magnetic resonance images of the examination subject are generated on the basis of the received magnetic resonance signals. Each image point in the magnetic resonance image is assigned to a small body volume known as a "voxel" and each brightness or intensity value of the images points is linked to the signal amplitude of the magnetic resonance signal received from this voxel. The relationship between a resonantly radiated RF pulse with field strength $B_1$ and the flip angle attained is given by the equation $$\alpha = \int_{t=0}^{\tau} \gamma \cdot B_1(t) \cdot dt \qquad \text{I}$$

wherein $\gamma$ is the gyromagnetic ratio, which can be considered to be a fixed material constant for most nuclear spin examinations, and $\tau$ is the effective duration of the radio-frequency pulse. The flip angle attained by the RF pulse and therefore the strength of the magnetic resonance signal consequently depend not only on the duration of the RF pulse but also on the strength of the radiated $B_1$ field. Spatial fluctuations in the field strength of the excited $B_1$ field therefore result in unwanted variations in the received magnetic resonance signal, which may distort the measurement result.

Disadvantageously, at high magnetic field strengths—which are necessarily present because of the required base magnetic field $B_0$ in a magnetic resonance apparatus—the RF pulses exhibit an inhomogeneous penetration behavior into conductive and dielectric media such as tissue. This causes the $B_1$ field to vary markedly within the measuring volume. Particularly in the case of ultra-high field magnetic resonance examinations in which more modern magnetic resonance systems with a basic magnetic field of three teslas or more are used, special measures therefore must be taken to achieve, throughout the volume, a maximally homogeneous distribution of the transmitted RF field of the radio-frequency antenna.

A simple but effective approach to solving the problem is to suitably modifying the (di-)electric environment of the examination subject in order to eliminate unwanted inhomogeneities. For this purpose, for example, dielectric elements of defined dielectric constant and conductivity can be positioned in the examination volume e.g. immediately at or on the patient. The material of these dielectric elements must have a high dielectric constant, preferably $\epsilon \geq 50$, the dielectric material thereby ensuring dielectric focusing. The material of the dielectric element, however, must not be overly conductive, as due to the skin effect an excessively high conductivity results in high eddy currents particularly in the surface region of the dielectric element, thereby producing a shielding effect which in turn attenuates the dielectric focusing effect. Using such dielectric elements it is possible, for example, to compensate the RF field minima typically occurring during magnetic resonance examinations of a patient in the chest and abdominal region by placing, on the patient's chest and abdomen, corresponding dielectric elements which in turn compensate the minima by locally increasing the penetrating RF field.

A plastic pouch containing distilled water with a dielectric constant of $\epsilon \approx 80$ and a conductivity of approx. 10 µS/cm has conventionally been used as a dielectric element. Using such water-filled "dielectric cushions" has the undesirable side-effect that they are visible in the magnetic resonance recordings. Additionally, due to foldover effects, the dielectric element may not be imaged within the magnetic resonance recording at the position where it is actually positioned in real space. Thus, for example, the foldover effect may cause the cushion to be shown at the lower edge instead of at the upper edge of the MR image. This creates the impression in the magnetic resonance recordings that the dielectric element is not on the patient's body but in the patient's body. It is indeed basically possible using so-called oversampling methods to record an image in such a way that the dielectric element is in the correct position. In such a case the dielectric element can be excised during subsequent processing or an image detail can be selected which does not include the dielectric element at all. Such oversampling methods, however, are extremely time-consuming and therefore prolong the measurement time.

In addition, in the German application DE 10 2004 015 859 A1 (corresponding to U.S. Ser. No. 11/095,159 filed Mar. 31, 2005) it is proposed, as a dielectric element, to employ a "dielectric cushion" filled with a relaxation agent, in particular a gel filling, instead of the above described distilled water filling, enabling the above described problem to be partially solved. However, it has been found that these cushions have an undesirable effect on the $B_0$ field. This can cause local geometric image distortions and, when using spectrally selective RF pulses, an inhomogeneous fat saturation. In addition, the homogenization of the transmitted RF field is not yet optimum.

SUMMARY OF THE INVENTION

An object of the present invention is to refine a dielectric element and a method for producing magnetic resonance recordings using dielectric elements so as to provide a simple means of further reducing or even completely preventing interference in the magnetic resonance recordings due to the positioned dielectric elements.

This object is achieved in accordance with the invention by a dielectric element containing a relaxation agent that reduces the relaxation time of the dielectric element, the relaxation agent being bound to mutually separated particles, causing both the $T_1$ relaxation time and the $T_2$ relaxation time to be reduced. The reduction can be up to three orders of magnitude depending on the material used for the dielectric element and relaxation agent. This means the relaxation time of a dielectric element, for example, which otherwise would have a relaxation time in the order of 1 s without the addition of a relaxation agent can be reduced to less than 1 ms by the presence of the relaxation agent. The relaxation agent consequently ensures that the relaxation times of the diagnostically irrelevant dielectric element are shorter than the normally used evolution times, i.e. the times between excitation pulse and data reception. This means that, for the majority of applications, the dielectric element is virtually invisible in the magnetic resonance images and interference-free measurement is possible. As the dielectric elements according to the invention are ultimately invisible in the images, this obviates the need for additional investment of measuring time to avoid foldover artifacts, it being possible with the method according to the invention to use normal imaging sequences unchanged and therefore without loss of performance. The desired $B_1$ field homogenization effect is nevertheless achieved.

Unlike in the case of the dielectric elements described in DE 10 2004 015 859 A1 mentioned above, the binding of the relaxation agent to solid particles and the associated immobilization largely avoids introducing free charge carriers into the dielectric element. This significantly reduces the conductivity of the dielectric element material, e.g. the filling of a dielectric cushion. This leads to a reduction in the shielding effect and therefore to a much greater homogenization effect overall. In order to achieve the same influencing of the $B_1$ field, a weaker dielectric element can therefore be used than hitherto. This results in much lower influencing of the $B_0$ field, thereby enabling the associated interfering effects described above to be prevented.

Particularly suitable as relaxation agents are paramagnetic substances. The paramagnetic atoms of these substances provide local distortions of the $B_0$ field. For a hydrogen atom moving in this locally inhomogeneous field, this produces the effect of a time-fluctuating $B_0$ field. Provided that the frequency of the fluctuations has components at the Larmor frequency, these are relaxation-effective. Examples of such paramagnetic substances are substances which have one or more of the following chemical elements—mainly with non-zero oxidation number: gadolinium, europium, iron, chromium, nickel, copper and/or manganese, the latter being preferred, particularly in the form of the positively charged $Mn^{2+}$ ion.

Because of the powerful relaxation effectiveness of $Mn^{2+}$, it is sufficient to use a low concentration in order to achieve adequate invisibility of the cushion in the image. This reduces the influencing of the $B_0$ field still further.

The relaxation agent, particularly when using a paramagnetic substance, is preferably present in a concentration of 10 to 200 mmol/kg, or even more preferably 30 to 100 mmol/kg, referred to the dielectric material of the dielectric element, e.g. referred to the gel filling in the case of a gel cushion.

In a preferred embodiment the dielectric element has a dielectric filling enclosed by a solid outer casing. The filling, which is in particular water-based, contains the relaxation agent bound to mutually separated particles. Consequently, in such a dielectric element in the form of a cushion, the cushion filling conventionally consisting only of water or an aqueous gel now additionally contains, according to the present invention, mutually separated particles to which a relaxation agent is bound which reduces the relaxation time of the filling.

The binding of the relaxation agent to solid particles incidentally enables the hazard posed by free metal ions of the relaxation agent, some of which may be toxic, to be reduced or eliminated even if the filling were to leak out and come into contact with the skin in the event of the outer solid casing being damaged.

For the solid casing, in principle any MR-invisible, sufficiently diffusion-tight material compatible with an MR system can be used. In particular, the solid casing is made from an organic polymer such as thermoplastic elastomers, more especially from soft PVC, polyethylene or polypropylene. Another option is for the solid casing to be comprised of a laminate with at least two layers which can be made from one or more organic polymers or a woven fabric. For example, a diffusion-tight inner side can be combined with a bio(skin)-compatible outer side. A woven fabric layer (e.g. made of aramid fibers such as Kevlar®) can be laminated in, particularly to provide protection against mechanical damage.

In a particularly preferred embodiment, the particles to which the relaxation agent is bound are contained in a gel, preferably an aqueous gel, i.e. the mutually separated particles to which the relaxation agent is bound are fixed by the gel in the dielectric element in a highly homogeneous distribution and therefore remain evenly distributed and cannot separate because of the density difference. This also has the advantage that during magnetic resonance measurement the dielectric element essentially retains its external shape—particularly its thickness—and the desired homogenization effect is uniformly achieved. In addition to keeping its shape, the element is easier to handle and more convenient to store. For example, a gel-filled cushion is generally more pleasant for the patient during an MRI scan than a liquid-filled dielectric element provided with a rigid casing for maintaining its shape. A further advantage of a gel containing solid particles which is contained e.g. in a cushion is that the filling and therefore possibly harmful substances cannot escape so easily if the casing is damaged.

As an alternative to a gel filling, it is possible in the case of a filling without gel to use a compartmentalized casing e.g. with ribs on the inside in order to improve the shape-keeping of the dielectric element.

As a gelling agent, any materials can be used which are toxicologically harmless and are capable, in the presence of the desired concentration of paramagnetic substance and in the presence of mutually separated particles, of forming a gel of the required consistency. For example, sodium polyacrylate can be used which is employed in a homogeneously distributed manner or preferably in the form of a dry, cross-linked sodium polyacrylate powder having a maximum particle size of 0.5 mm, preferably less than approx. 0.2 mm. Larger particle sizes may cause the final gel to be less homogeneous. It is generally the case that the smaller the particle size, the more homogeneous the final gel. In addition, agarose, polysaccharides, polyacrylic acid, polyvinylpyrrolidone, polyvinyl alcohol, polyacrylamide or modified starch or cellulose can be used as gelling agents or for setting a high viscosity or a thixotropic or structurally viscous flow behavior.

The underlying acrylate monomer can likewise be substituted (e.g. by alkyl, alkoxy or hydroxyalkyl groups). Copolymers with possibly substituted acrylamide can also be used.

The gelling agent is usually present in a concentration of 0.1-10 wt. %, preferably approx. 0.5-5 wt. %.

The gel can additionally contain a preservative which is present in particular in a proportion of 20 wt. %, preferably. 25 wt. %. Examples of preservatives are 1,2-propanediol, ethanol or 2-propanol.

It is particularly advantageous that a commercially available water-based ultrasound contact gel which already contains gelling agents and possibly preservatives can be used as the basic composition for the dielectric element.

The mutually separated particles to which the relaxation agent is bound are preferably made of an ion exchange material, in particular a cation exchange material. The cation exchange material is, for example, charged with positively charged ions of the relaxation agent which are bound by negatively charged groups of the ion exchange material, strongly acidic cation exchange materials being particularly preferred, as they ensure more permanent ionic binding of the positive ions.

An example of a suitable cation exchange material is a sulfonated copolymer of styrene and divinylbenzene, such as that available from the Dow Chemical Company under the name Dowex® 50 WX8 (particle size approx. 40-80 µm). However, other copolymers as well as other negatively charged functionalization groups can likewise be used. Further specific examples of possible ion exchangers which can be used in the present invention include Lewatit® from Lanxess or Amberlite®, Amberlyst®, Amberjet®, Duolite® from Rohm and Haas.

The mutually separated particles to which the relaxation agent is bound, e.g. the particles of the ion exchange material, preferably have a size of <0.5 mm, in particular <0.1 mm. Extremely fine particles (down to a lower limit of approx. 10 µm) are particularly preferred, because this keeps the spacing between the particles as small as possible while reducing separation tendencies due to the density difference between the particles and the mainly aqueous environment.

DESCRIPTION OF THE DRAWINGS

FIG. 3 shows the effects of various dielectric cushions on the $B_0$ field.

DESCRIPTION OF THE PREFERRED EMBODIMENTS

Figure 1:
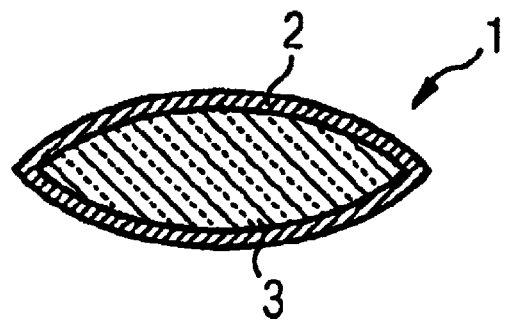
FIG. 1 schematically illustrates a dielectric cushion in accordance with the invention.

The dielectric element shown in FIG. 1 is a dielectric cushion 1 having an outer plastic film casing 2 and a filling 3 that contains a paramagnetic substance bound to particles of a cation exchanger. The plastic film 2 is a bio-friendly material which is relatively thin, but nevertheless sufficiently stable to prevent egress of the filling 3 contained therein. The plastic film 2 is preferably welded all round.

When in use, the dielectric cushion 1 can additionally be covered with a washable cushion cover which can be changed before using the dielectric cushion 1 on another patient. Advantageously the plastic film casing 2 can be disinfected using normal means.

In the specific example, the filling 3 is an aqueous sodium polyacrylate gel containing particles of the strongly acidic cation exchanger Dowex® 50 WX8 which is charged with $Mn^{2+}$ ions. The cation exchanger used had the following characteristics: moisture content approx. 50 wt. %, ion exchange capacity: 4.8 meq/g, Mn content approx. 11 wt. % referred to the dry substance. The $Mn^{2+}$ concentration of the finished preparation was 56 mmol/kg. This special filling 3 has the advantage that, apart from the desired properties of producing homogenization of the transmitted and received RF field and being invisible in MR images, it is completely harmless for the patient.

Figure 2A:
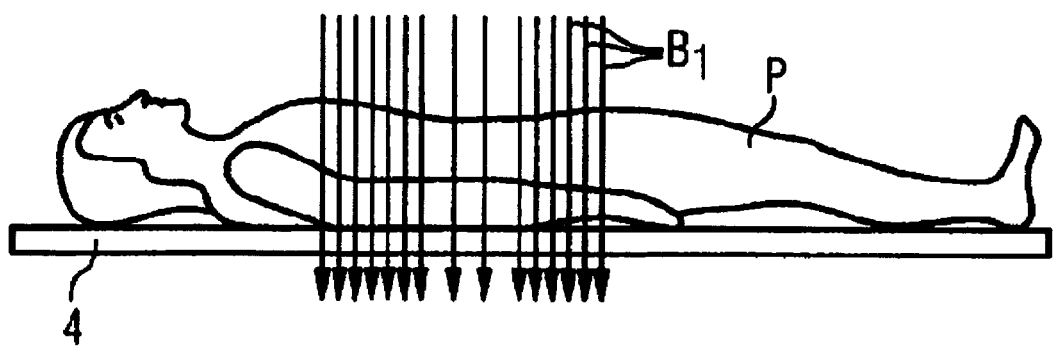
FIG. 2a schematically illustrates a patient positioned on an examination table during irradiation with a $B_1$ field without dielectric cushion.
Figure 2B:
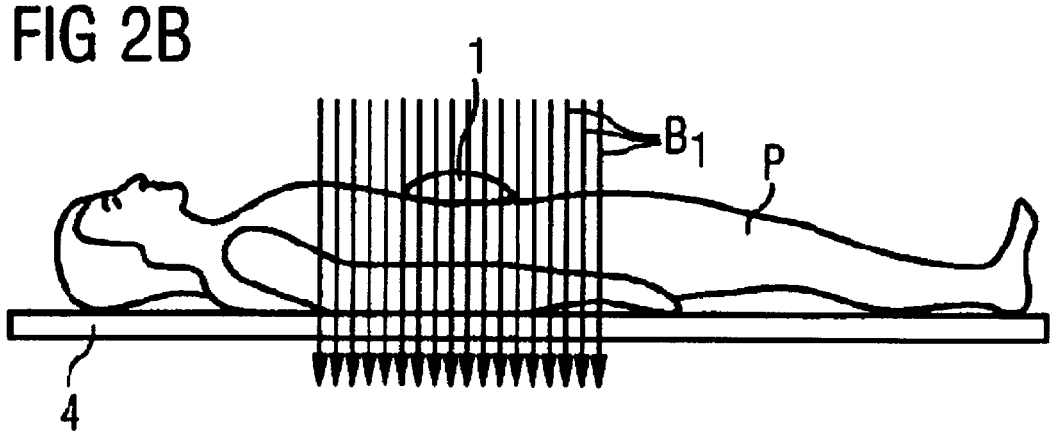
FIG. 2b schematically illustrates the patient as shown in FIG. 2a during irradiation with a $B_1$ field with a dielectric cushion as shown in FIG. 1 positioned on the patient's abdomen.

The effect of such a dielectric element 1 for homogenizing the $B_1$ field during magnetic resonance recording is schematically illustrated in FIGS. 2a and 2b.

FIG. 2a depicts a patient P lying on an examination table 4 inside a magnetic resonance tomograph (not shown). A $B_1$ field which is here schematically illustrated by field lines is emitted by an RF antenna of the magnetic resonance tomograph. The denseness of the field lines $B_1$ is designed to represent the strength of the $B_1$ field. In the abdominal region of the patient P there is shown a $B_1$ field minimum which usually occurs in the patient's abdominal or thoracic region during magnetic resonance imaging under real conditions. In this region the field lines are less dense than in the other regions.

This effect is compensated by placing a dielectric cushion 1 as shown in FIG. 1 on the abdomen of the patient P. This is schematically illustrated in FIG. 2b. The dielectric cushion 1 produces local intensification of the $B_1$ field in the region of the cushion 1, thereby neutralizing the field inhomogeneity overall so that a more homogeneous $B_1$ field is present than without the dielectric cushion 1.

FIG. 3 shows a comparison of the effects of different cushions on the B0 field of a magnetic resonance tomograph.

In particular, FIG. 3 shows the effect of a known product cushion $K_1$ as described in DE 10 2004 015 859 A1 (water, 1,2-propandiol, gelling agent (cross-linked sodium polyacrylate powder), Gd-DPTA (gadopentetic acid)), the effect of a cushion $K_2$ according to the present invention (ultrasound gel (consisting of water, 1,2-propandiol, gelling agent sodium polyacrylate), Mn-charged ion exchanger) and the effect of a reference cushion $K_3$ (like cushion $K_2$, but without Mn-charged ion exchanger). A number of measurements were additionally carried out without cushions.

The examination subject was in all cases a cylindrical water phantom (doped with nickel sulfate). The edge length of the recorded image area is 500 mm×500 mm. All the measurements were carried out at a field strength of 3T.

FIG. 3 shows the measurement of an unwanted effect, namely distortion of the base magnetic field $B_0$. The stripes can be interpreted as contour lines of the $B_0$ field. In the upper row of images, the $B_0$ field varies by 0.4 ppm per line, in the lower row by 0.1 ppm per line. The right-hand image in the lower row shows—in respect of the $B_0$ field distortion—the ideal case in which there are no additional effects due to the applied cushion. The right-hand image is to be considered as a reference. The more the $B_0$ profile deviates from this reference, the more marked the $B_0$ distortion effect. The cushion $K_3$ without relaxation agent and the cushion $K_2$ according to the invention exhibit a very similar pattern which only deviates slightly from the reference—the $B_0$ distortion is minimal in these cases. A different result occurs with the product cushion $K_1$; here the $B_0$ field distortions occurring are clearly visible.

There are incidentally two basic reasons why, in the recordings shown in FIG. 3, the $B_0$ profile of the phantom with the cushion $K_3$ without relaxation agent does not appear completely identical to the reference profile (without cushion), even though in this case no paramagnetic ions are present in the cushion $R_3$: a) the cushion $K_3$ is visible, and is therefore taken into account as part of object-specific $B_0$ optimization ("shimming"), b) the intensity distribution in the phantom varies because of the $B_1$ shaping effect—this too affects shimming.

Figure 4:
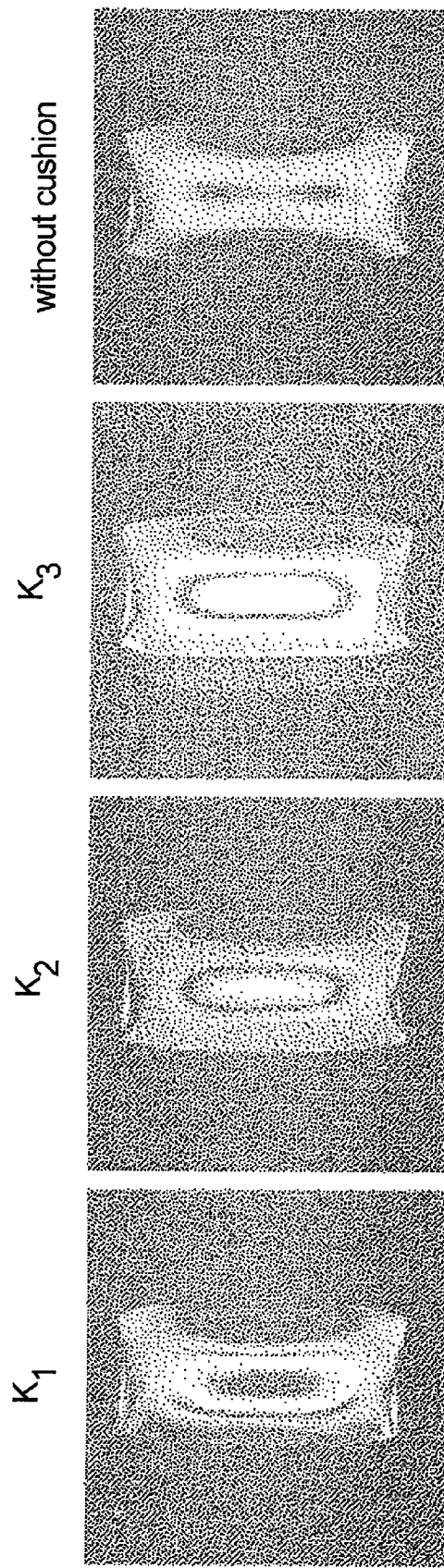
FIG. 4 shows the effects of various dielectric cushions on the $B_1$ field.

FIG. 4 shows the $B_1$ effects of the different dielectric cushions $K_1$, $K_2$, $K_3$ which are labeled as in FIG. 3. The aim here was to demonstrate the unwanted effect, namely the shaping of the $B_1$ field in the subject. In the reference measurement without cushion (right), dielectric focusing with a high $B_1$ amplitude in the center of the phantom and low amplitude at the edge may be seen. Each of the dielectric cushions $K_1$, $K_2$, $K_3$ measured is capable of accentuating the $B_1$ field close to the cushion (the latter being invisible in the images except for cushion $K_3$ without relaxation agent, but always positioned on the left side of the image). In the cushion $K_2$ according to the invention and the cushion $K_3$ without relaxation agent, the effect is even somewhat more marked than in the product cushion $K_1$.

The physical reason for this is as follows: the known product cushion $K_1$ contains a significant proportion of free ions which contribute to the conductivity of the material. However, a higher conductivity produces a $B_1$ shielding effect which counteracts the desired $B_1$ accentuating effect. In the cushion $K_3$ without relaxation agent and the cushion $K_2$ according to the invention—due to the ion exchanger principle—significantly fewer free ions are present, and the conductivity of the gel is in these cases lower. The shielding effect is therefore less of a factor in these cushions, which means that the cushion $K_2$ according to the invention is clearly superior to the known cushions $K_1$.

Figure 5:
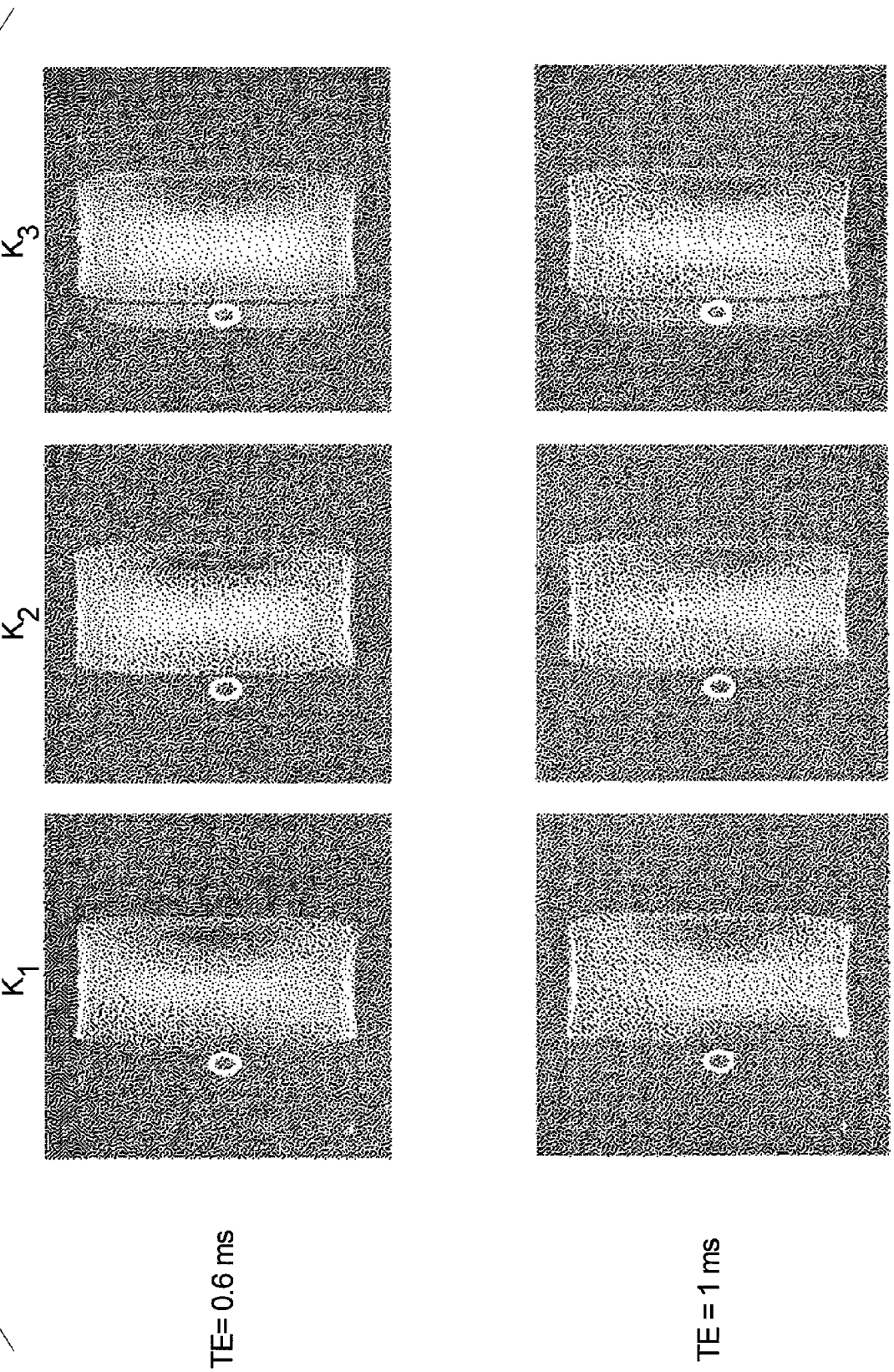
FIG. 5 shows the results of measuring the MR invisibility of various dielectric cushions.

FIG. 5 shows the result of an examination of the magnetic resonance invisibility of the different dielectric cushions $K_1$, $K_2$, $K_3$. These are again labeled as in FIGS. 3 and 4.

An important feature of the dielectric cushion $K_2$ according to the present invention is, as already described, sufficient invisibility in MR images. Images with short evolution times TE are critical here; the shortest diagnostically used times are currently approx. 0.5 to 1.0 ms—corresponding images are shown in FIG. 5 (upper image row TE=0.6 ms; lower image row TE=1 ms). While the cushion $K_3$ without relaxation agent is clearly visible in the image, both the known product cushion $K_1$ and the cushion $K_2$ according to the invention are invisible. To quantify this, the average image intensity in the area of the cushions was analyzed (these regions are marked with a cross in the images). In spite of the low $Mn^{2+}$ concentration, the cushion $K_2$ according to the invention and the known product cushion $K_1$ are similarly invisible.

To summarize:

The cushion $K_2$ according to the invention exhibits a stronger $B_1$ shaping effect than the known product cushion $K_1$, which can be utilized e.g. to make the cushion smaller and therefore lighter.

The cushion $K_2$ according to the invention shows weaker $B_0$ distortion than the known product cushion $K_1$.

The cushion $K_2$ according to the invention and the known product cushion $K_1$ are similarly invisible.

The inventive cushion $K_2$ according to the present invention is therefore superior to the known product cushion $K_1$ and therefore to be preferred.

This has likewise been confirmed in initial measurements on patients/test subjects.

The manufacture of the specific filling material according to the present invention, as used for the measurements (shown in FIGS. 3 to 5) in the cushion $K_2$ according to the invention, will now be described.

3300 g ultrasound gel (74 wt. % water, 25 wt. % 1, 2-propandiol and approx. 1 wt. % sodium polyacrylate) were placed in a 5-liter beaker. Then, 200 g Dowex® 50 WX8, charged with approx. 11 wt. % manganese referred to the dry substance, were stirred in in portions. After 15 min stirring time the ion exchange powder was homogeneously distributed in the ultrasound gel.

This gel was inserted into a cushion casing made of polyethylene which was then welded, the cushion measuring 35 cm×25 cm×4 cm.

The procedure detailed above and the dielectric cushion illustrated are only examples that can be modified in various ways by those skilled in the art, without departing from the scope of the invention. Although the invention has essentially been described using the example of magnetic resonance equipment in the medical field, the possible uses of the invention are not limited to this area, but the invention can likewise also be used in scientific and/or industrially used magnetic resonance equipment.

We claim as our invention:

1. A dielectric element configured for positioning on an examination subject in a magnetic resonance data acquisition device, said dielectric element comprising dielectric material and a relaxation agent bound to mutually separated particles, said dielectric material and said relaxation agent bound to mutually separated particles, in combination, locally homogenizing a $B_1$ field distribution during acquisition of magnetic resonance data from the examination subject with said magnetic resonance data acquisition device.

2. A dielectric element as claimed in claim 1 wherein said relaxation agent incorporates a paramagnetic substance.

3. A dielectric element as claimed in claim 2 wherein said paramagnetic substance includes at least one element selected from the group consisting of gadolinium, europium, iron, chromium, nickel, copper and manganese.

4. A dielectric element as claimed in claim 1 wherein said relaxation element contains $Mn^{2+}$ as a paramagnetic substance.

5. A dielectric element as claimed in claim 1 comprising said relaxation agent in a concentration between 10 and 200 mmol/kg with respect to said dielectric material.

6. A dielectric element as claimed in claim 5 comprising said relaxation agent in a concentration between 30 and 100 mmol./kg, with respect to said dielectric material.

7. A dielectric element as claimed in claim 1 comprising a non-permeable casing containing said dielectric material and said relaxation agent bound to mutually separated particles, as a filling.

8. A dielectric element as claimed in claim 7 wherein said filling comprises a gel comprising said mutually separated particles to which said relaxation is bound.

9. A dielectric element as claimed in claim 8 wherein said gel is an aqueous gel.

10. A dielectric element as claimed in claim 8 wherein said gel comprises sodium polyacrylate as a gelling agent.

11. A dielectric element as claimed in claim 10 wherein said sodium polyacrylate is a dry sodium polyacrylate powder comprised of particles having a maximum particle size of 0.5 mm.

12. A dielectric element as claimed in claim 11 wherein said dry sodium polyacrylate powder is comprised of particles having a maximum size of less than 0.2 mm.

13. A dielectric element as claimed in claim 10 comprising sodium polyacrylate in a concentration between 0.1 to 10 wt. %.

14. A dielectric element as claimed in claim 13 comprising sodium polyacrylate in a concentration between 0.5 to 5 wt. %.

15. A dielectric element as claimed in claim 8 wherein said gel contains a preservative.

16. A dielectric element as claimed in claim 1 wherein said mutually separated particles include an ion exchange material.

17. A dielectric element as claimed in claim 16 wherein said ion exchange material is a cation exchanger.

18. A dielectric element as claimed in claim 17 wherein said cation exchanger is a sulfonated copolymer of styrene and divinylbenzene.

19. A dielectric element as claimed in claim 1 wherein said mutually separated particles to which said relaxation agent is bound have a size of less than 0.5 mm.

20. A dielectric element as claimed in claim 9 wherein said mutually separated particles to which said relaxation agent is bound have a size of less than 0.1 mm.

21. A method for acquiring magnetic resonance data from an examination subject comprising:
    placing an examination subject in a magnetic resonance data acquisition device that emits a $B_1$ field;
    placing a dielectric element on the examination subject in the magnetic resonance data acquisition device, said dielectric element comprising dielectric material and a relaxation agent bound to mutually separated particles; and
    operating said magnetic resonance data acquisition system to acquire magnetic resonance data from the examination subject with the dielectric element thereon, said dielectric element, during said magnetic resonance data acquisition, locally homogenizing the $B_1$ field.

* * * * *